(12) United States Patent
Shiu et al.

(10) Patent No.: US 9,761,791 B2
(45) Date of Patent: Sep. 12, 2017

(54) CONDUCTIVE PAD STRUCTURE AND METHOD OF FABRICATING THE SAME

(71) Applicant: UNITED MICROELECTRONICS CORP., Hsin-Chu (TW)

(72) Inventors: Jian-Bin Shiu, Hsinchu (TW); Tung-Sheng Lee, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 93 days.

(21) Appl. No.: 14/325,386

(22) Filed: Jul. 8, 2014

(65) Prior Publication Data

US 2015/0349242 A1 Dec. 3, 2015

(30) Foreign Application Priority Data

May 27, 2014 (TW) .............................. 103118453 A

(51) Int. Cl.
  *H01L 43/04* (2006.01)
  *H01L 23/00* (2006.01)
  *H01L 43/14* (2006.01)
  *H01L 43/06* (2006.01)

(52) U.S. Cl.
  CPC .............. *H01L 43/04* (2013.01); *H01L 24/03* (2013.01); *H01L 24/05* (2013.01); *H01L 43/14* (2013.01); *H01L 43/065* (2013.01); *H01L 2224/05541* (2013.01); *H01L 2224/05553* (2013.01); *H01L 2224/05558* (2013.01)

(58) Field of Classification Search
  CPC ......... H01L 43/04; H01L 24/03; H01L 24/05; H01L 43/14; H01L 2224/05541; H01L 3/06; H01L 3/065
  See application file for complete search history.

(56) References Cited

U.S. PATENT DOCUMENTS

| | | | | |
|---|---|---|---|---|
| 6,020,640 | A * | 2/2000 | Efland | H01L 23/53233 257/751 |
| 7,545,050 | B1 * | 6/2009 | Daubenspeck | H01L 23/3171 257/779 |
| 8,633,707 | B2 | 1/2014 | Filippi | |
| 2005/0006759 | A1 * | 1/2005 | Huang | H01L 24/11 257/734 |
| 2005/0258539 | A1 * | 11/2005 | Minda | H01L 24/03 257/738 |
| 2006/0292711 | A1 * | 12/2006 | Su | G01R 31/046 438/14 |
| 2007/0210788 | A1 * | 9/2007 | Mitsuzuka | G01R 33/09 324/207.21 |
| 2009/0127638 | A1 * | 5/2009 | Kilger | B81B 7/007 257/415 |

(Continued)

*Primary Examiner* — Brett Feeney
*Assistant Examiner* — Erik T Peterson
(74) *Attorney, Agent, or Firm* — Winston Hsu

(57) ABSTRACT

A structure of a conductive pad is provided. The structure includes a first conductive layer. A first dielectric layer covers the first conductive layer. A first contact hole is disposed within the first dielectric layer. A second conductive layer fills in the first conductive hole and extends from the first conductive hole to a top surface of the first dielectric layer so that the second conductive layer forms a step profile. A second dielectric layer covers the first dielectric layer and the second conductive layer. A third conductive layer contacts and covers the step profile.

17 Claims, 5 Drawing Sheets

(56) References Cited

U.S. PATENT DOCUMENTS

| | | | |
|---|---|---|---|
| 2009/0243098 A1* | 10/2009 | Farooq | H01L 24/11 257/738 |
| 2011/0024900 A1* | 2/2011 | Walter | H01L 23/5283 257/737 |
| 2011/0233766 A1* | 9/2011 | Lin | H01L 21/76877 257/737 |
| 2014/0054764 A1* | 2/2014 | Lu | H01L 23/293 257/737 |
| 2014/0252514 A1* | 9/2014 | Kim | H01L 43/065 257/421 |
| 2014/0264824 A1* | 9/2014 | Lu | H01L 24/81 257/734 |

* cited by examiner

CONDUCTIVE PAD STRUCTURE AND METHOD OF FABRICATING THE SAME

BACKGROUND OF THE INVENTION

1. Field of the Invention

The invention relates to a conductive pad structure and method of fabricating the same, and more particularly to a conductive pad structure applied to a semiconductor package with a hall sensor, and a method of fabricating the same.

2. Description of the Prior Art

A hall sensor is a transducer that varies its output voltage in response to a magnetic field. Hall sensors are used for proximity switching, positioning, speed detection, and current sensing applications.

Hall sensors are popularly used in semiconductor chips. A metal shield is often set above the hall sensor in order to prevent the magnetic field or the electric field from interfering with the hall sensor. In addition, several conductive pads are positioned on the semiconductor chip for transmitting in/out signals of the hall sensor. According to current fabricating processes, the upmost metal layer of the conductive pad is formed in the same step as the aforesaid metal shield. The metal shield and the upmost metal layer are relatively thin because they are formed in the same step. The thinness causes difficulties during the formation of the upmost metal layer, and may causes discontinuousness in the upmost metal layer.

SUMMARY OF THE INVENTION

Therefore, a novel conductive pad structure and a fabricating process thereof are provided in the present invention to form an upmost metal layer with a continuous profile.

According to a preferred embodiment of the present invention, a conductive pad structure includes a first conductive layer, a first dielectric layer covering the first conductive layer, a first contact hole disposed within the first dielectric layer, a second conductive layer filling in the first contact hole wherein the second conductive layer extends from the first contact hole to a top surface of the first dielectric layer so that the second conductive layer forms a step profile, a second dielectric layer covering the first dielectric layer, and a third conductive layer contacting and covering the step profile.

According to another aspect of the present invention, a method of fabricating a conductive pad structure includes the following steps: forming a first conductive layer; forming a first dielectric layer to cover the first conductive layer; forming a first contact hole within the first dielectric layer; filling the first contact hole with a second conductive layer, wherein the second conductive layer extends from the first contact hole to a top surface of the first dielectric layer so that the second conductive layer forms a step profile; and forming a third conductive layer to contact and cover the step profile.

These and other objectives of the present invention will no doubt become obvious to those of ordinary skill in the art after reading the following detailed description of the preferred embodiment that is illustrated in the various figures and drawings.

DETAILED DESCRIPTION

FIG. 1 to FIG. 8 are drawings illustrating a fabricating method of a conductive pad structure according to a preferred embodiment of the present invention. A substrate 10 is provided. A first conductive pad M1 and an inter-metal dielectric (IMD) layer 12 are formed on the substrate 10 in sequence. The substrate 10 may be a bulk silicon substrate, a germanium substrate, a gallium arsenide substrate, a silicon germanium substrate, an indium phosphide substrate, a gallium nitride substrate, a silicon carbide substrate, a silicon on insulator (SOI) substrate, or other suitable materials. The first conductive layer M1 is preferably aluminum, a metal layer, or other suitable conductive materials. The IMD layer 12 may be a silicon oxide layer, a silicon nitride layer or other dielectrics.

Figure 1:
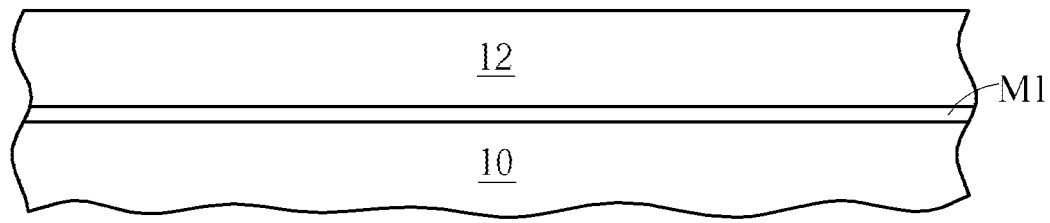
FIG. 1 to FIG. 8 are drawings illustrating a fabricating method of a conductive pad structure according to a preferred embodiment of the present invention.
Figure 2:
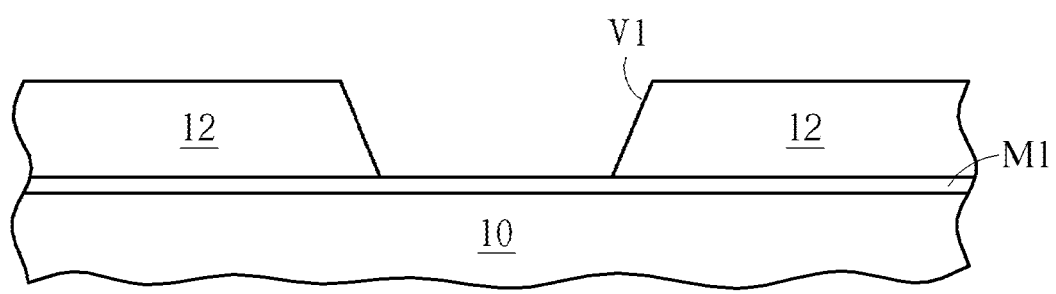
Figure 3:
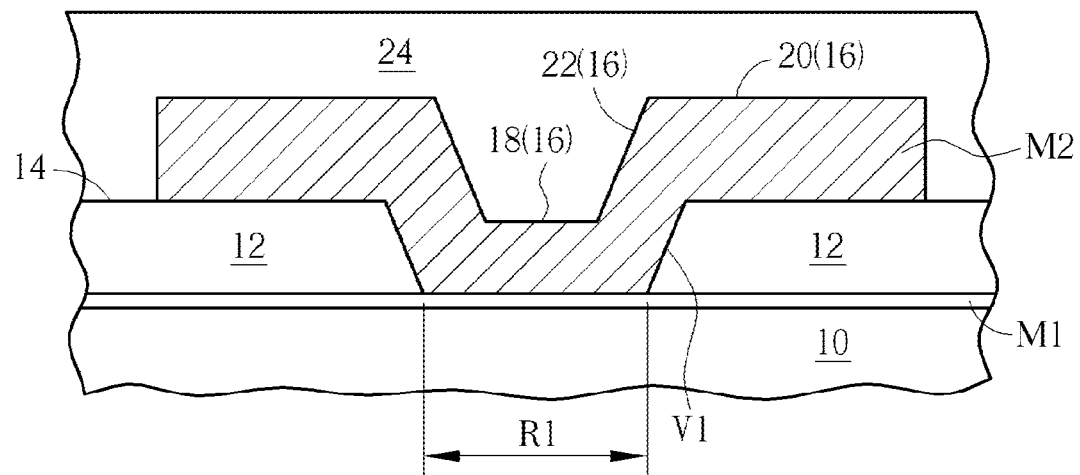
Figure 4:
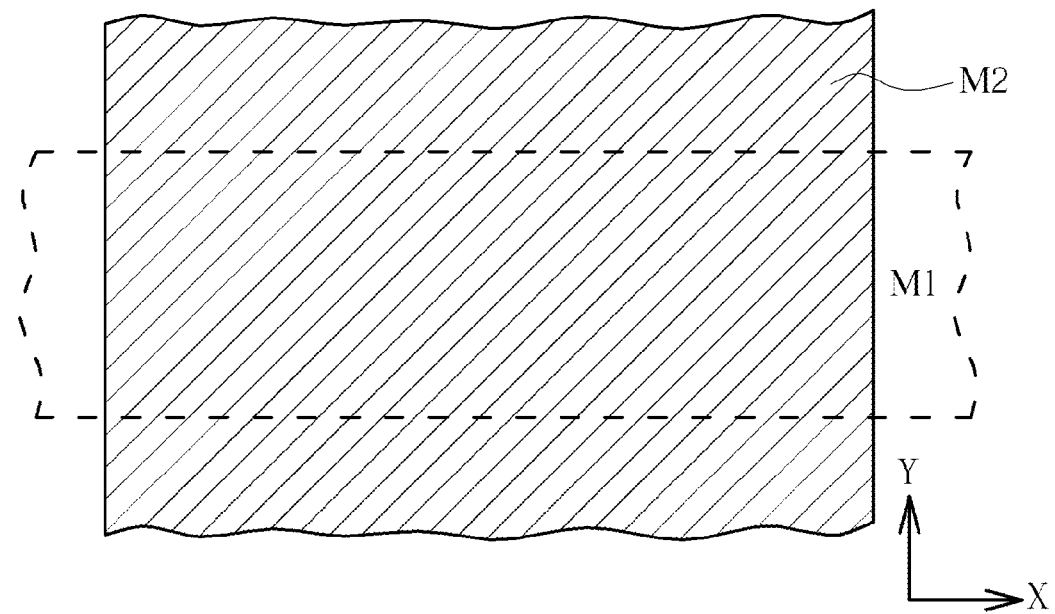

As shown in FIG. 2, a first contact hole V1 is formed within the IMD layer 12 by utilizing a lithography and etching process, and the first conductive layer M1 is exposed through the first contact hole V1. Later, as shown in FIG. 3, a second conductive layer M2 is formed to conformally fill in the first contact hole V1. The second conductive layer M2 extends from the first contact hole V1 to a top surface 14 of the IMD layer 12. After that, part of the second conductive layer M2 on the IMD layer 12 is removed so that the second conductive layer M2 forms a step profile 16. In detail, the second conductive layer M2 includes a first surface 18 disposed within the first contact hole V1 and a second surface 20 disposed on the IMD layer 12. The first surface 18 and the second surface 20 are both parallel to the top surface 14 of the IMD layer 12. A second conductive layer M2 includes a sloping surface 22 which connects the first surface 18 to the second surface 20. The first surface 18, the second surface 20 and the sloping surface 22 form the step profile 16. In addition, the second conductive layer M2 within the first contact hole V1 contacts the first conductive layer M1. Subsequently, an inter-metal dielectric (IMD) layer 24 is formed to cover the second conductive layer M2 and the IMD layer 12. The IMD layer 24 contacts the second conductive layer M2 and the IMD layer 12. Please refer to FIG. 4. FIG. 4 shows a schematic top view of FIG. 3 For clarity, only the first conductive layer M1 and the second conductive layer M2 are shown in FIG. 4, and other elements are omitted. Please refer to both FIG. 3 and FIG. 4. The second conductive layer M2 crosses the first conductive layer M1. In addition, the first conductive layer M1 extends in an X direction, and the second conductive layer M2 extends in a Y direction, wherein the X direction is different from the Y direction.

Figure 5:
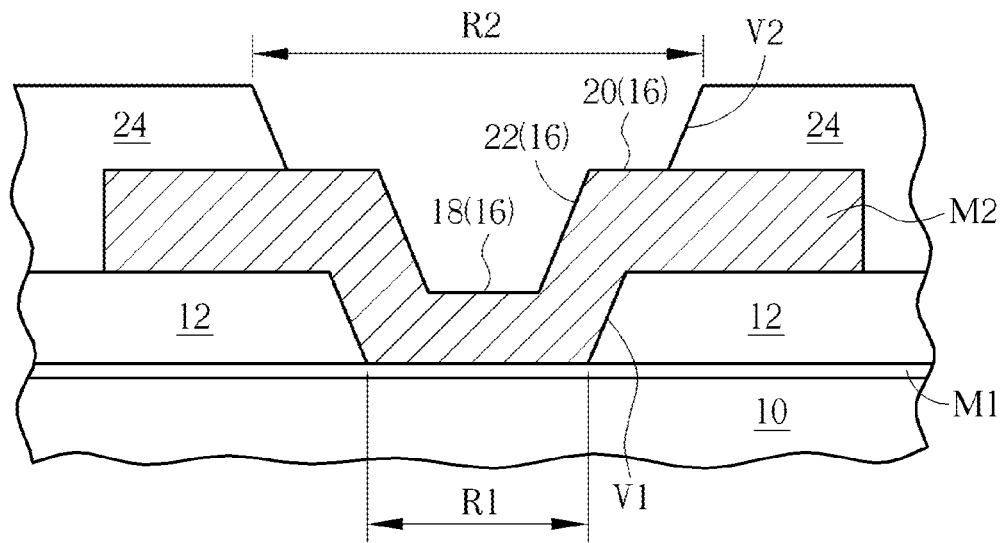
Figure 6:
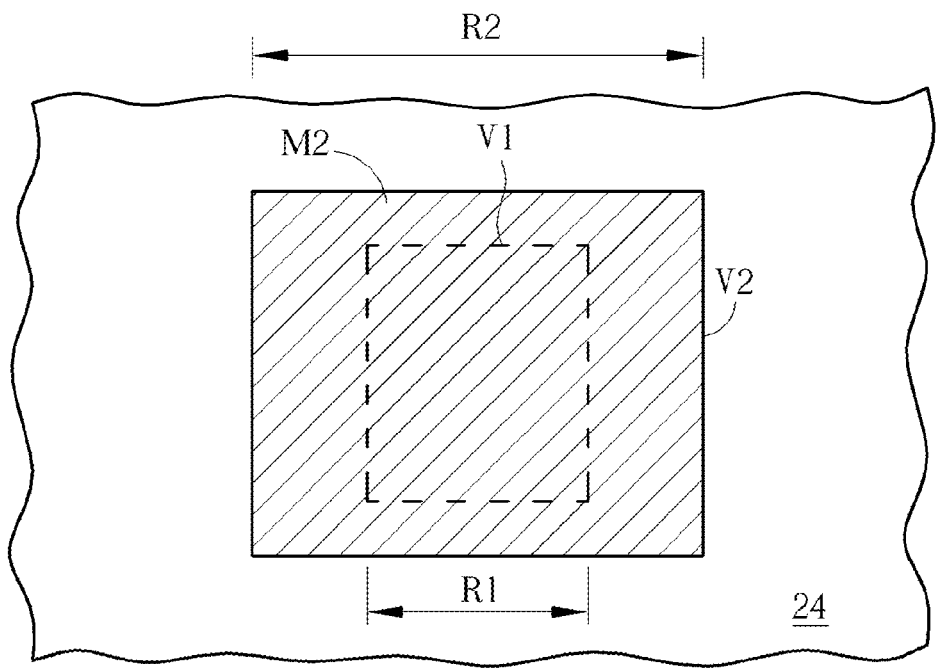

As shown in FIG. 5, a second contact hole V2 is formed within the IMD layer 24 by utilizing a lithography and etching process, and the second conductive layer M2 is exposed through the second contact hole V2. FIG. 6 shows a schematic top view of FIG. 5. For clarity, only the IMD layer 24, the second conductive layer M2, the second contact hole V2 and the first contact hole V1 are shown in FIG. 6, and other elements are omitted. Please refer to FIG. 5 and FIG. 6. An opening of the second contact hole V2 is greater than an opening of the first contact hole V1. The opening of the second contact hole V2 overlaps the opening of the first contact hole V1. A region R2 of the second contact hole V2 entirely overlaps a region R1 of the first contact hole V1 to expose the step profile 16 of the second conductive layer M2 through the second contact hole V2.

Figure 7:
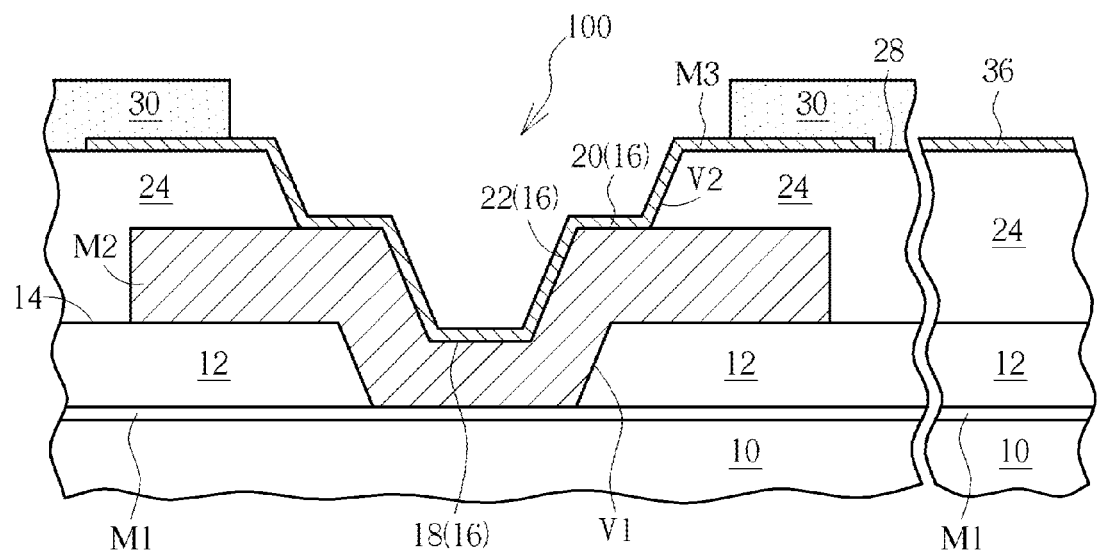

As shown in FIG. 7, a third conductive layer M3 fills in the second contact hole V2 conformally. The third conductive layer M3 continuously and conformally covers the step profile 16. In other words, the third conductive layer M3 continuously and conformally contacts the first surface 18, the sloping surface 22 and the second surface 20 of the second conductive layer M2. In addition, the third conductive layer M3 extends from the second contact hole V2 to a top surface 28 of the IMD layer 24. Then, the third conductive layer M3 is patterned to remove part of the third conductive layer M3 on the top surface 28 of the IMD layer 24. At this point, the conductive pad structure 100 of the present invention is completed. Finally, based on different requirements, a protective layer 30 can be formed optionally on the third conductive layer M3 to cover the third conductive layer M3.

Figure 8:
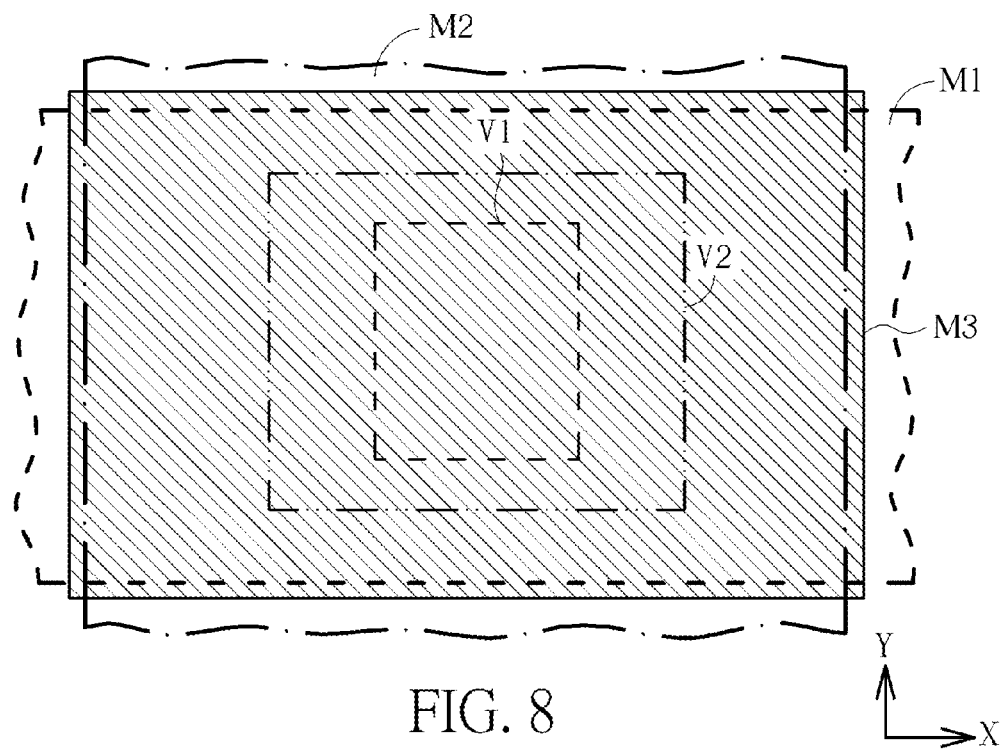

FIG. 8 shows a schematic top view of FIG. 7. For clarity, only the relative positions of the first conductive layer M1, the second conductive layer M2, the third conductive layer M3, the second contact hole V2 and the first contact hole V1 are shown in FIG. 8, and other elements are omitted. In FIG. 8, the first conductive layer M1 is shown by a bold dashed line. The second conductive layer M2 is shown by a bold dot-dashed line. The first contact hole V1 is shown by a dashed line, and the second contact hole V2 is shown by a dot-dashed line. As shown in FIG. 8, the third conductive layer M3 serves as a conductive pad, the size of the third conducive layer M3 is greater than the opening of the first contact hole V1, and is also greater than the opening of the second contact hole V2.

Figure 9:
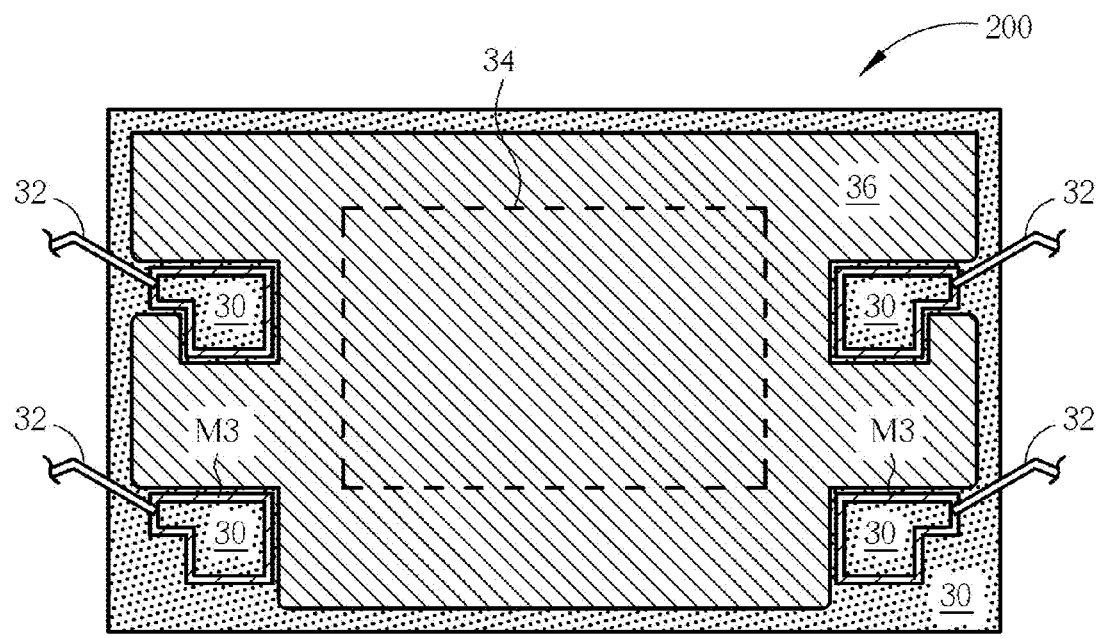
FIG. 9 depicts a semiconductor package with a hall sensor according to a preferred embodiment of the present invention.

FIG. 9 depicts a semiconductor package with a hall sensor according to a preferred embodiment of the present invention. As shown in FIG. 9, the conductive pad structure of the present invention can be applied to a semiconductor package 200 with a hall sensor. The third conductive layer M3 can contact with a wire bonding 32 so the wire bonding 32 can send out the signal of the hall sensor 34. In addition, a protective layer 36 such as a metal layer covers the hall sensor 34. The protective layer 36 serves as a metal shielding layer for keeping the noise disturbance from the hall sensor 34. Please refer to both FIG. 7 and FIG. 9. The protective layer 36 is preferably formed together with the third conductive layer M3 using the same material in the same fabricating step. For example, firstly a preliminary third conductive layer is formed to cover the step profile 16. At a later point in the process, the protective layer 36 will be defined and separate from the third conductive layer M3 by patterning the preliminary third conductive layer using a lithography and etching process. Refer to both FIG. 7 and FIG. 9 for details of the position of the first conductive layer M1, the second conductive layer M2 and the hall sensor 34. Please refer to FIG. 8 and FIG. 9. The first conductive layer M1 extends in the X direction, and can be electrically connected to the hall sensor 34 at somewhere underneath the protective layer 36 via some interconnection. The second conductive layer M2 is also electrically connected to the hall sensor 34 because the first conductive layer M1 contacts the second conductive layer M2. The first conductive layer M1 and the second conductive layer M2 electrically connect to the hall sensor 34 for receiving or sending signals of the hall sensor 34.

Please refer to FIG. 7 The conductive pad structure 100 of the present invention includes a substrate 10. A first conductive layer M1 covers the substrate 10. An IMD layer 12 covers the conductive layer M1. A first contact hole V1 is disposed within the IMD layer 12. A second conductive layer M2 fills in the first contact hole V1, and the second conductive layer M2 extends from the first contact hole V1 to a top surface 14 of the IMD layer 12 so that the second conductive layer M2 forms a step profile 16. In detail, the second conductive layer M2 includes a first surface 18 disposed within the first contact hole V1 and a second surface 20 disposed on the IMD layer 12. The first surface 18 and the second surface 20 are both parallel to the top surface 14 of the IMD layer 12. A second conductive layer M2 includes a sloping surface 22 connecting the first surface 18 to the second surface 20. The first surface 18, the second surface and the sloping surface 22 form the step profile 16. An IMD layer 24 covers the IMD layer 12 and the second conductive layer M2. A second contact hole V2 is disposed within the IMD layer 24. The first conductive layer M1, the second conductive layer M2 and the third conductive layer M3 are preferably aluminum, metals or other suitable materials. The ratio of thickness of the second conductive layer M2 to the third conductive layer M3 is 3. For example, the thickness of the second conductive layer M2 is preferably 15000 angstroms. The thickness of the third conductive layer M3 is preferably 5000 angstroms. The second conductive layer M2 is relatively thick, so a higher current density can be transferred by the second conductive layer M2. The third conductive layer M3 is relatively thin, therefore the protective layer 36 formed in the same fabricating step as the third conductive layer M3 also is relatively thin. The protective layer 36 is primarily for electrostatic shielding, and therefore usually is relatively thin. The IMD layer 12 and the IMD layer 24 can be silicon oxide, silicon nitride or other dielectrics. The thickness of the IMD layer 12 is preferably 13000 angstroms. The thickness of the IMD layer 12 is preferably around 17000 angstroms to 33000 angstroms. For example, the thickest part of the IMD layer 24 is 33000 angstroms. The thinnest part of the IMD layer 24 is 17000 angstroms. Please refer to FIG. 6. An opening of the second contact hole V2 is greater than an opening of the first contact hole V1. A region R2 of the second contact hole V2 entirely overlaps a region R1 of the first contact hole V1. Please refer to FIG. 7 again. A third conductive layer M3 continuously covers the step profile 16. In other words, the third conductive layer M3 continuously covers a first surface 18, a second surface 20 and the sloping surface 22. The third conductive layer M2 extends from the second contact hole V2 to a top surface 28 of the IMD layer 24. It is noteworthy that the third conductive layer M3 is a continuous material layer which extends from the first surface 18 to the sloping surface 22, the second surface 20, the second contact hole V2 and the top surface 28.

Figure 10:
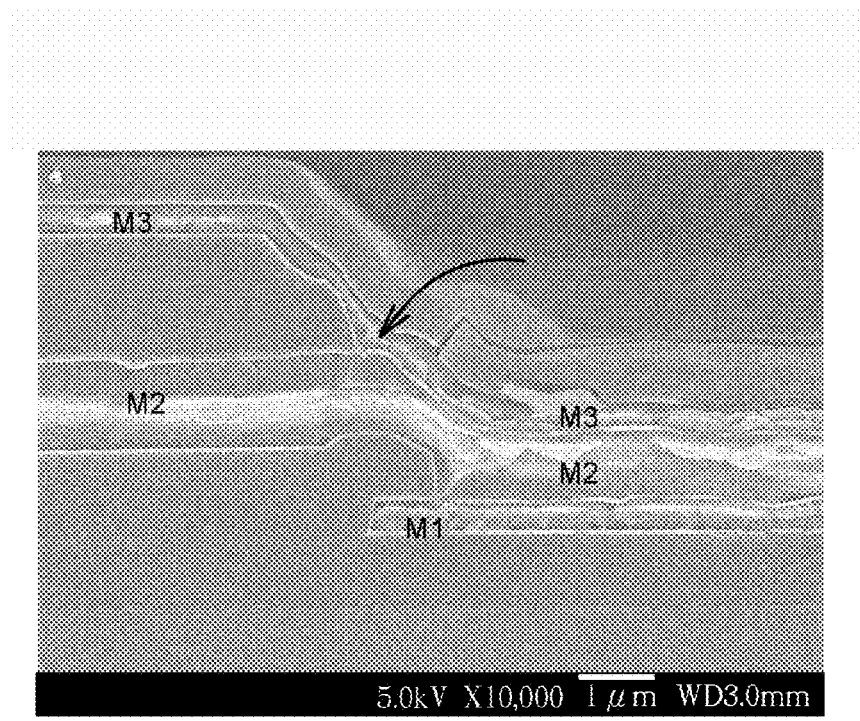
FIG. 10 shows a SEM image of a conductive pad structure of the present invention.

FIG. 10 shows a SEM image of a conductive pad structure of the present invention. As shown in FIG. 10, the third conductive layer M3 continuously contacts the sloping surface (marked by an arrow) of the second conductive layer M2.

The conductive pad structure of the present invention includes the first contact hole V1 and the second contact hole V2. The opening of the second contact hole V2 is greater than the opening of the first contact hole V1. The region R2 of the second contact hole V2 overlaps the region R1 of the first contact hole V1 so that the step profile 16 can be exposed through the second contact hole V2. In this way, the thin third conductive layer M3 can continuously contact the step profile 16, and the third conductive layer M3 can also continuously extend to the top surface 28 of the IMD layer 24.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A conductive pad structure, comprising:
 a first conductive layer;
 a first dielectric layer covering the first conductive layer;
 a first contact hole disposed within the first dielectric layer;
 a second conductive layer filling in the first contact hole, the second conductive layer extending from the first contact hole to a top surface of the first dielectric layer so that the second conductive layer forms a step profile, wherein the second conductive layer is thicker than the first conductive layer and the first conductive layer intersects the second conductive layer;
 a second dielectric layer covering the first dielectric layer and the second conductive layer;
 a third conductive layer contacting and covering the step profile, wherein the third conductive layer is disposed on the second dielectric layer,
 a hall sensor electrically connecting to the first conductive layer and the second conductive layer; and
 a protective layer disposed on the second dielectric layer and covering the hall sensor.

2. The conductive pad structure of claim 1, further comprising:
 a second contact hole disposed within the second dielectric layer, wherein an opening of the second contact hole is greater than an opening of the first contact hole.

3. The conductive pad structure of claim 2, wherein the third conductive layer fills in the second contact hole conformally, and the third conductive layer extends to a top surface of the second dielectric layer.

4. The conductive pad structure of claim 1, wherein the second conductive layer comprises a first surface and a second surface, the first surface is parallel to the top surface of the first dielectric layer, and the second surface is parallel to the top surface of the first dielectric layer.

5. The conductive pad structure of claim 4, wherein the second conductive layer comprises a sloping surface connecting the first surface to the second surface.

6. The conductive pad structure of claim 5, wherein the third conductive layer contacts the sloping surface and covers the sloping surface continuously.

7. The conductive pad structure of claim 1, wherein the second conductive layer within the first contact hole contacts the first conductive layer.

8. The conductive pad structure of claim 1, further comprising a wire bonding contacting the third conductive layer.

9. A method of fabricating a conductive pad structure, comprising:
 forming a first conductive layer electrically connecting to a hall sensor;
 forming a first dielectric layer covering the first conductive layer;
 forming a first contact hole within the first dielectric layer;
 forming a second conductive layer filling the first contact hole, the second conductive layer extending from the first contact hole to a top surface of the first dielectric layer so that the second conductive layer forms a step profile;
 forming a second dielectric layer covering the first dielectric layer and the second conductive layer;
 removing part of the second dielectric layer to expose part of the step profile;
 forming a preliminary third conductive layer contacting and covering the step profile; and
 patterning the preliminary third conductive layer to form a third conductive layer and a protective layer, wherein the third conductive layer contacts the step profile and the protective layer covers the hall sensor.

10. The method of fabricating a conductive pad structure of claim 9, further comprising:
 after removing part of the second dielectric layer, forming a second contact hole within the second dielectric layer above the second conductive layer.

11. The method of fabricating a conductive pad structure of claim 10, wherein an opening of the second contact hole is greater than an opening of the first contact hole.

12. The method of fabricating a conductive pad structure of claim 10, wherein the third conductive layer fills in the second contact hole conformally, and the third conductive layer extends from the second contact hole to a top surface of the second dielectric layer.

13. The method of fabricating a conductive pad structure of claim 9, wherein the second conductive layer fills in the first contact hole comformally, and the second conductive layer extends to the top surface of the first dielectric layer.

14. The method of fabricating a conductive pad structure of claim 9, wherein the second conductive layer comprises a first surface and a second surface, the first surface is parallel to the top surface of the first dielectric layer, and the second surface is parallel to the top surface of the first dielectric layer.

15. The method of fabricating a conductive pad structure of claim 14, wherein the second conductive layer comprises a sloping surface connecting the first surface to the second surface.

16. The method of fabricating a conductive pad structure of claim 15, wherein the third conductive layer contacts the sloping surface and covers the sloping surface continuously.

17. The method of fabricating a conductive pad structure of claim 9, wherein the second conductive layer within the first contact hole contacts the first conductive layer.

* * * * *